(12) United States Patent
Chung et al.

(10) Patent No.: US 6,562,651 B2
(45) Date of Patent: May 13, 2003

(54) METHOD OF MANUFACTURING A SEMICONDUCTOR DEVICE HAVING CONTACT PADS

(75) Inventors: Seung-pil Chung, Seoul (KR); Kyeong-Koo Chi, Seoul (KR); Jung-Sik Jeon, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/916,319

(22) Filed: Jul. 30, 2001

(65) Prior Publication Data

US 2002/0090837 A1 Jul. 11, 2002

(30) Foreign Application Priority Data

Jan. 11, 2001 (KR) .......................................... 2001-1615

(51) Int. Cl.[7] .............................................. H01L 21/00
(52) U.S. Cl. ......................................... 438/98; 438/595
(58) Field of Search ........................ 438/98, 275, 305, 438/401, 462, 595, 639, 596, 669, 735

(56) References Cited

U.S. PATENT DOCUMENTS 5,275,972 A * 1/1994 Ogawa et al.
6,245,625 B1 * 6/2001 Gau
6,268,292 B1 * 7/2001 Violette et al.
6,376,924 B1 * 4/2002 Tomita et al.
6,387,759 B1 * 5/2002 Park et al.

* cited by examiner

Primary Examiner—David Nelms
Assistant Examiner—Phuc T. Dang
(74) Attorney, Agent, or Firm—Volentine Francos, PLLC

(57) ABSTRACT

A method of manufacturing a semiconductor device includes forming an insulated wiring pattern on a semiconductor substrate, and forming a lower interlayer insulating layer on the wiring pattern. A hard mask is formed on the lower insulating layer. Self-aligned contact holes are formed to expose the substrate under openings or gaps of the wiring pattern by partially etching the lower interlayer insulating layer be using the hard mask as an etch mask. A surface treatment process is carried out against surface of the substrate exposed through the self-aligned contact holes. Then, a first conductive layer is conformably formed over the whole surface of the substrate over which the surface treatment process is finished. At this time, projections are formed on sidewalls of the self-aligned contact holes. The first conductive layer is anisotropically etched to remove the projection. A second conductive layer fills completely the self-aligned contact holes.

16 Claims, 6 Drawing Sheets

US 6,562,651 B2

METHOD OF MANUFACTURING A SEMICONDUCTOR DEVICE HAVING CONTACT PADS

FIELD OF THE INVENTION

The present invention relates to method of manufacturing a semiconductor device, and more particularly to method of manufacturing a semiconductor device having contact pads.

This application is a counterpart of Korean Patent Application No. 2001-1615, filed on Jan. 11, 2001, the disclosure of which is incorporated by reference herein in its entirety and for all purposes.

BACKGROUND OF THE INVENTION

The need to reduce the size of semiconductor chips has driven the effort to decrease line width and spacing at the integrated circuit (IC) level. In order to increase the alignment margin in photolithography process for forming contact holes which penetrate a given region between the lines, a self-aligned contact (SAC) technique has been developed and used. Also, in the case of a highly integrated semiconductor device, a technique of decreasing aspect ratio of contact holes by disposing contact pads between a lower and a upper conductive layer is widely-used.

FIG. 1 to FIG. 5 are flow diagrams showing the process steps of a conventional method of forming contact pads in self-aligned contact holes.

Referring now to FIG. 1, a metal-oxide-semi-conductor (MOS) structure includes an insulated gate pattern 8 formed over the semiconductor substrate 1. The gate pattern 8, which is insulated from the substrate 1 by a gate insulating layer 3, includes gate electrodes 5, and a capping layer pattern 7. Adjacent the gate pattern 8, sidewall spacers 9 are formed.

FIG. 2 shows, a conformal etch stop layer 11 formed followed by formation of a first interlayer insulating layer 13 over the surface of the substrate on which the sidewall spacers 9. The etch stop layer 11 is formed of a layer of material, which has an etch selectivity relative to the first interlayer insulating layer 13. For example, the etch stop layer 11 is formed of a silicon nitride layer and the first interlayer insulating layer 13 is formed of a silicon oxide layer. On the first interlayer insulating layer 13, a hard mask layer is formed. The hard mask layer is formed of a layer of material which has an etch selectivity relative to the first interlayer insulating layer 13 and the etch stop layer 11. Illustratively, the hard mask layer is a polysilicon layer. The hard mask layer is patterned to form a hard mask 15. The patterning of the hard mask layer exposes a particular region of the first interlayer insulating layer 13. The hard mask 15 defines position of contact holes formed in a subsequent process.

FIG. 3 shows that the first interlayer insulating layer 13 and the etch stop layer 11 are etched to form self-aligned contact holes 17. Formation of contact holes 17 exposes a surface of the substrate 1 under openings or gaps of the gate patterns 8. In the surface of the substrate 1, etch damage may be generated. The etch damage may cause deterioration of contact resistance characteristic between the surface of the substrate 1 and contact pads formed in a subsequent process. As such, an etch damage layer may be removed by carrying out a pre-cleaning process that includes use of a dry and a wet cleaning process against the substrate on which the self-aligned contact holes 17 are formed. The wet cleaning process is carried out by using an oxide etchant in order to remove native oxides remained on the surface of the substrate 1 exposed through the self-aligned contact holes 17. Thus, when the pre-cleaning process is finished, undercuts 19 are formed under edges of openings or gaps of the hard mask 15.

As shown in FIG. 4, a doped polysilicon layer 21, which fills the self-aligned contact holes 17, is formed over the substrate over which the pre-cleaning process is carried out. At this time, voids 23 can be formed in the doped polysilicon layer 21 positioned in the self-aligned contact holes 17.

The voids 23 are formed due to the undercuts 19.

As shown in FIG. 5, the doped polysilicon layer 21, the hard mask 15 and the first interlayer insulating layer 13 are etched to form contact pads 21a in the self-aligned contact holes 17 by a planarization process. Because of the voids 23, recesses are formed in center portions of the contact pads 21a. Thereafter, a second interlayer insulating layer 25 is formed over the substrate on which the contact pads 21a are formed. The second interlayer insulating layer 25 is patterned to form openings 27. To wit, bit line contact holes or storage node contact holes are formed which expose the contact pads 21a.

It is difficult to completely remove portions 25a of the second interlayer insulating layer 25 deposited in the recesses even though the second interlayer insulating layer 25 is over-etched. Therefore, exposed area of the contact pads 21a is decreased, thereby increasing contact resistance between the contact pads 21a and a conductive layer formed in the openings 27 in a subsequent process.

What is needed, therefore is a method of fabricating contact pads with improved contact resistance that overcomes the shortcomings of the related art described above.

SUMMARY OF THE INVENTION

According to an illustrative embodiment of the present invention, a method of manufacturing a semiconductor device having contact pads includes conformably forming a first conductive layer in self-aligned contact holes, and then transforming profile of sidewalls of the first conductive layer to have a positive slope by anisotropically etching the first conductive layer. A second conductive layer is formed over substrate on which the first conductive layer is anisotropically etched.

Advantageously, by virtue of the illustrative process voids are not formed in the self-aligned contact holes.

BRIEF DESCRIPTION OF THE DRAWINGS

The invention is best understood from the following detailed description when read with the accompanying drawing figures. It is emphasized that the various features are not necessarily drawn to scale. In fact, the dimensions may be arbitrarily increased or decreased for clarity of discussion.

DETAILED DESCRIPTION

In the following detailed description, for purposes of explanation and not limitation, exemplary embodiments disclosing specific details are set forth in order to provide a thorough understanding of the present invention. However, it will be apparent to one having ordinary skill in the art having had the benefit of the present disclosure, that the present invention may be practiced in other embodiments that depart from the specific details disclosed herein. Moreover, descriptions of well-known devices, methods and materials may be omitted so as to not obscure the description of the present invention.

Figure 1:
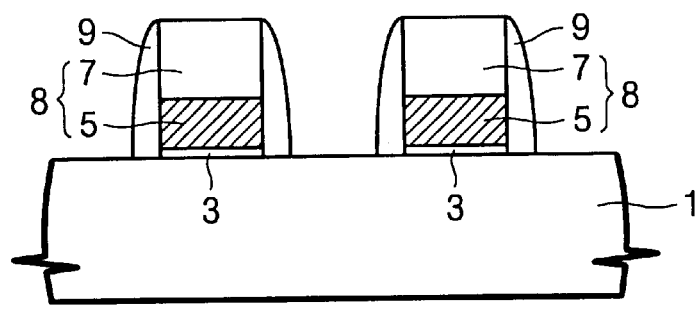
FIG. 1 to FIG. 5 are flow diagrams showing the process steps of a conventional method of manufacturing a semiconductor device.
Figure 2:
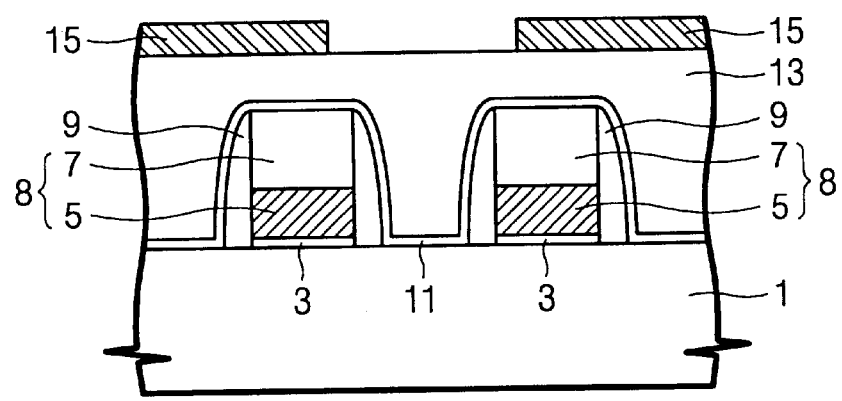
Figure 3:
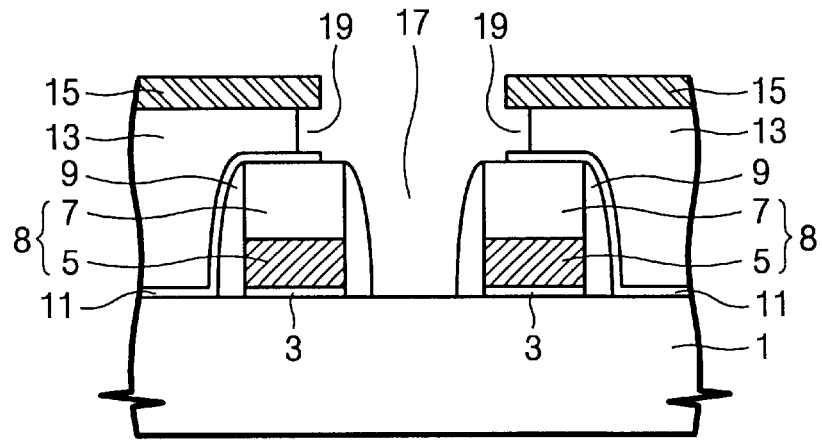
Figure 4:
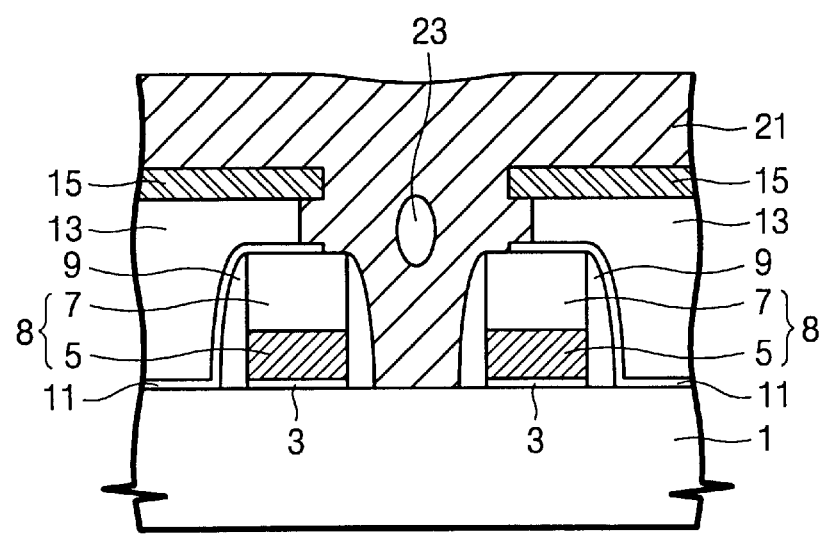
Figure 5:
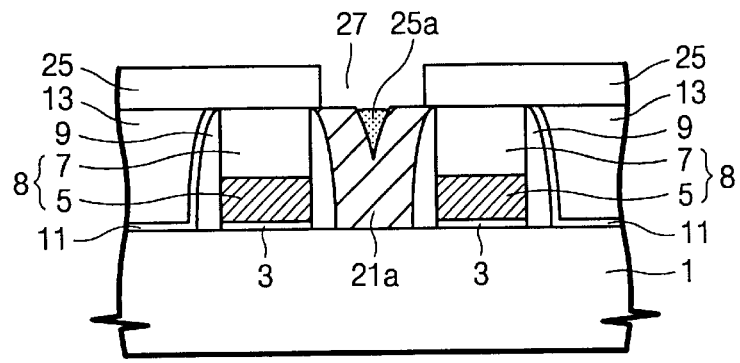
Figure 6:
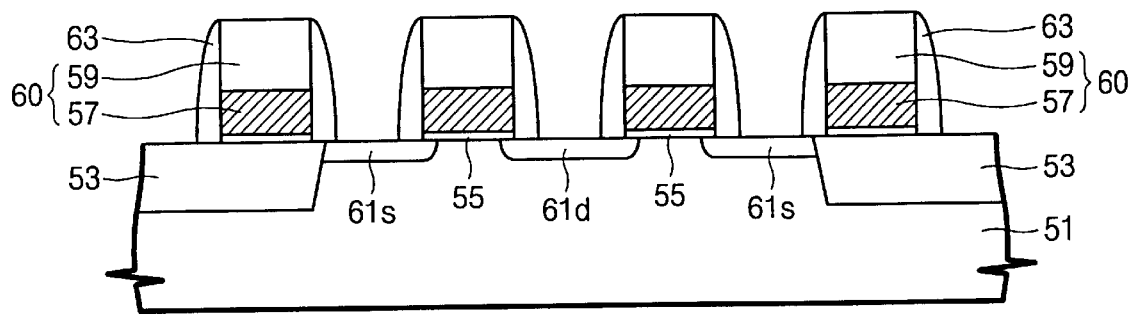
FIG. 6 to FIG. 12 are flow diagrams showing the process steps of a method of manufacturing a semiconductor device in accordance with the present invention.

FIG. 6 to FIG. 12 are flow diagrams showing the process steps of a method of manufacturing a dynamic random access memory (DRAM) in accordance with the present invention Referring now to FIG. 6, an isolation layer 53 is formed on a semiconductor substrate 51 (e.g. silicon substrate) to define an active region. The isolation layer 53 is formed illustratively by known techniques. Such as a local oxidation of silicon (LOCOS) process, or a trench isolation process. A gate insulating layer 55 is formed on the whole surface of the substrate including the isolation layer 53. The gate insulating layer 55 is formed illustratively of an insulator layer such as a thermal oxide layer. A conductive layer and a capping-insulating layer are formed over the semiconductor substrate. In the exemplary embodiment described presently, the conductive layer is formed of a doped polysilicon layer or a metal polycide layer. The capping-insulating layer includes an insulating layer having an etch selectivity with respect to a silicon oxide layer which is widely-used as an interlayer insulating layer. For example, it is useful that the capping-insulating layer is formed of a silicon nitride layer.

As shown, the capping-insulating layer and the conductive layer are continuously patterned to form an insulated wiring pattern 60 over the active region and the isolation layer 53. The wiring pattern 60 includes a conductive layer pattern 57 and a capping-insulating layer pattern 59 overlaid on the conductive layer pattern 57. The conductive layer pattern 57 illustratively forms word lines. For example, wiring pattern 60 may form a word line pattern of a dynamic random access memory (DRAM).

Illustratively, ion implantation is carried out against the substrate 51 to form low concentration impurity regions 61s (source), 61d (drain) on the substrate 51 between openings or gaps of the wiring pattern 60. To this end, the low concentration impurity regions 61s and 61d may be formed by using the wiring pattern 60 and the isolation layer 53 as an ion implantation mask. In the ion implantation, the conductivity of implanted ions is different from that of the substrate 51. Also, a dose of implanted ions is $1.0 \times 10^2$ ion atoms/cm$^2$ to $1.0 \times 10^{14}$ ion atoms/cm$^2$. As shown in FIG. 6, the active region is divided into three regions. Specifically, three low concentration impurity regions 61s, 61d are separated by the wiring pattern 60. The low concentration impurity region 61d formed in the center portion of the active region forms a common drain region and the low concentration impurity regions 61s formed in both sides of the active region form source regions. Moreover, spacers 63 are formed on sidewalls of the wiring pattern 60. Illustratively, the spacers 63 are formed of a layer of the same material as the capping insulating layer.

Figure 7:
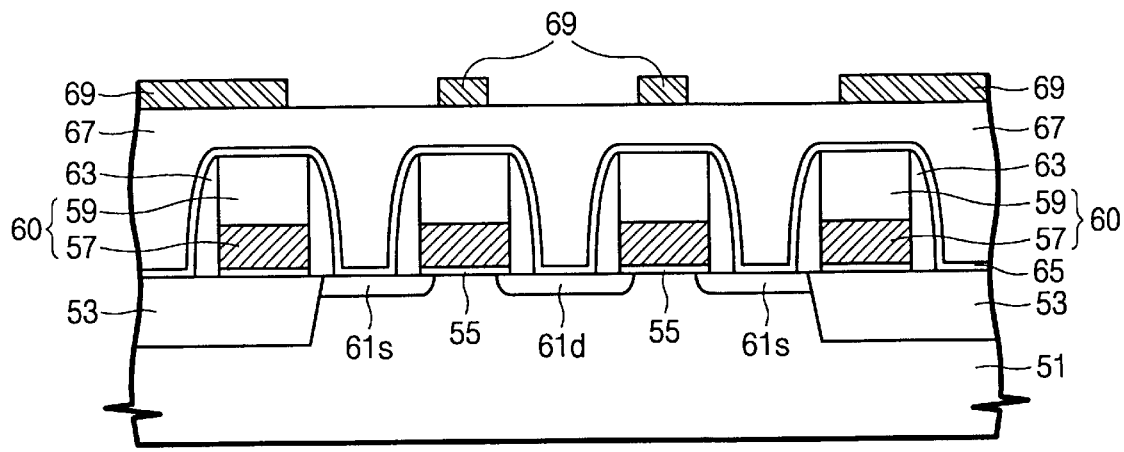

Referring to FIG. 7, a conformal etch stop layer 65 is formed over the substrate 51 as shown. The conformal etch stop layer 65 is illustratively formed of an insulating layer, for example a silicon nitride layer which exhibits etch selectivity relative a silicon oxide layer which is widely used as an interlayer insulating layer. A lower interlayer insulating layer 67 is formed over the conformal etch stop layer 65.

Illustratively, the lower interlayer insulating layer 67 is formed of a plantarized silicon oxide layer. A hard mask layer 69 is formed over the lower interlayer insulating layer 67. The hard mask layer 69 may be formed of a layer of material which exhibits an etch selectivity with respect to the etch stop layer 65 and the lower interlayer insulating layer 67. For example, the hard mask layer is formed of a silicon layer, such as a polysilicon layer. As shown, the hard mask 69 is patterned to expose a given region of the lower interlayer insulating layer 67.

Figure 8:
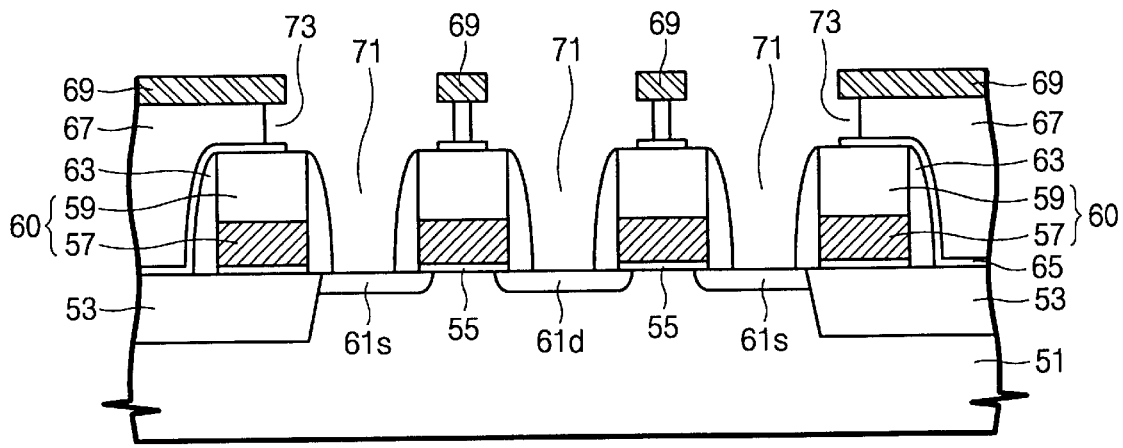

Referring to FIG. 8, exposed portions of the lower interlayer insulating layer 67 are etched to expose portions of the etch stop layer 65 in the openings of the wiring pattern 60 by using the hard mask 69 as an etch mask. The exposed portions of the etch stop layer 65 are etched by using the hard mask 69 as an etch mask, so that self-aligned contact holes 71 are formed to expose the common drain region 61d and the source regions 61s. On surfaces of the common drain region 61d and the source regions 61s exposed through the self-aligned contact holes 71, an etch damage layer (not shown) may be formed. Since the existence of the etch damage layer may increase contact resistance, it is sure to be removed. A surface treatment process including a dry and a wet cleaning process may carry out against exposed surfaces of the common drain region 61d and the source regions 61s.

According to the illustrative embodiment of the present invention, the dry cleaning process is carried out by using a fluorine-containing gas as a process gas and a low electric power. Illustratively, the electric power is a substrate bias below 200W. For purposes of illustration and not limitation, the fluorine-contained gas is $CF_4$ gas. In addition, $O_2$ gas and Ar gas are used. Alternatively, the dry cleaning process can be carried out by using $CF_4$ gas and $O_2$ gas as an etch gas without the substrate bias. After carrying out the dry cleaning process, the wet cleaning process is carried out. Illustratively, the wet cleaning process includes removing contaminants remaining on surfaces of the common drain region 61d and the source regions 61s by using a mixture of $NH_4OH$, $H_2O_2$, and de-ionized water. Moreover, native oxides generated in removing of contaminants may be removed, by using an oxide etchant such as a hydrofluoric acid. The native oxides are generated due to $H_2O_2$ in the mixture for removing contaminants. Finally, sidewalls of the lower interlayer insulating layer 67 exposed through the self-aligned contact holes 71 are isotropically etched. Accordingly, as shown in FIG. 8, undercuts 73 are formed under edges of openings or gaps of the hard mask 69.

Figure 9:
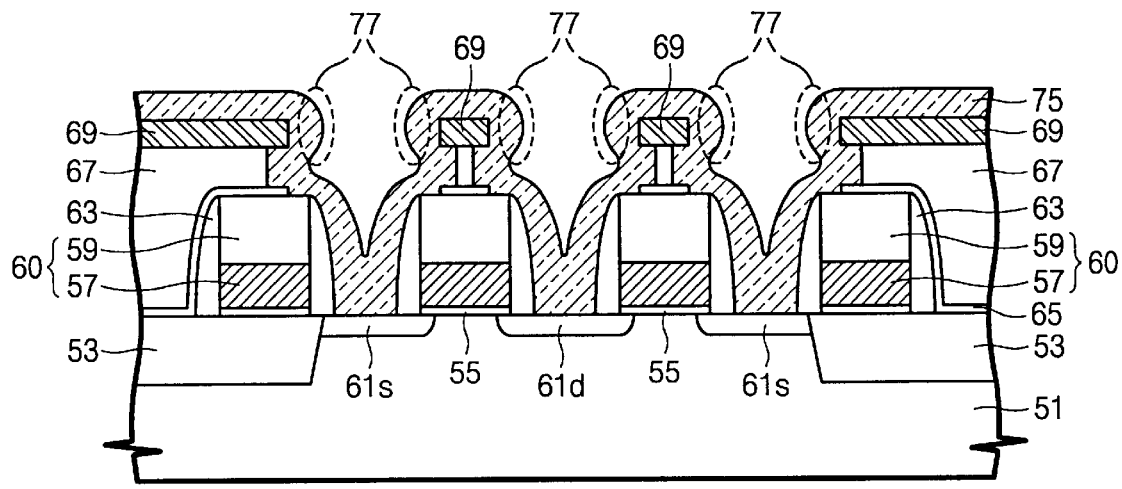

Referring to FIG. 9, a first conductive layer 75 is conformally formed over the substrate as shown. As such, projections 77 are formed on the tops of sidewalls of the self-aligned contact holes 71. The projections 77 are formed because of the undercuts 73. Illustratively, the first conductive layer 75 is formed of a doped polysilicon layer by using a low pressure chemical vapor deposition (LPCVD).

Figure 10:
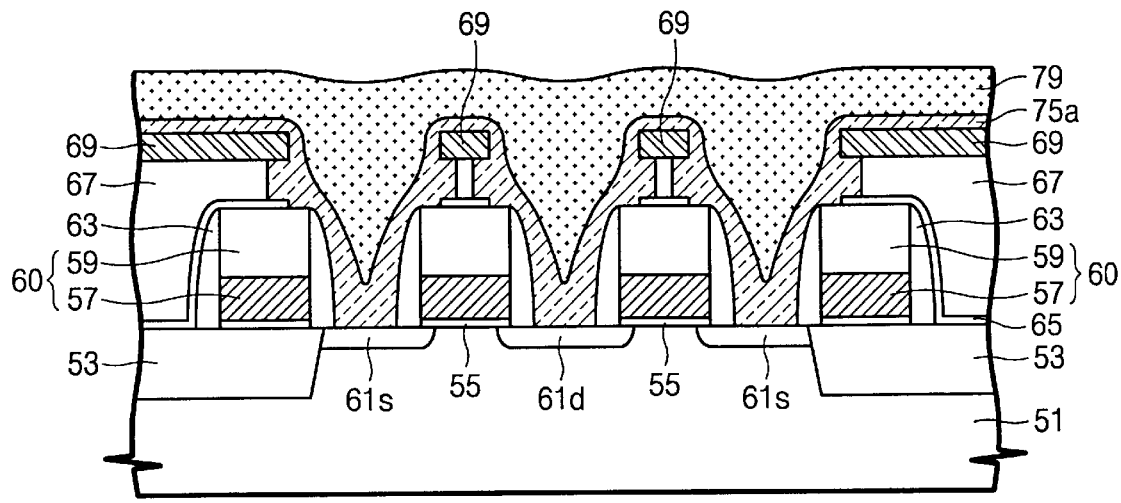

Referring to FIG. 10, the first conductive layer 75 is anisotropically etched to remove projections 77. As shown, each of sidewalls of the first conductive layer 75 in the self-aligned contact holes 71 has a positive slope. The process of anisotropically etching the first conductive layer 75 is illustratively carried out by using $Cl_2$ gas, $O_2$ gas, and HBr gas. As a result, a transformed conductive layer 75a is formed. In addition, the hard mask 69 can be etched during the process of anisotropically etching the first conductive layer 75. Thereafter, a second conductive layer 79 is formed over the whole surface of the substrate over which the transformed conductive layer 75a is formed. Illustratively, the second conductive layer 79 is formed of a layer of the same material as the first conductive layer 75. Also, the second conductive layer 79 is formed to a thickness enough to substantially fill the self-aligned contact holes 71 in which the transformed conductive layer 75a is conformally formed. Because the sidewalls of the transformed conductive layer 75a has a positive slope, voids are not formed in the second conductive layer 79 in the self-aligned contact holes 71.

Figure 11:
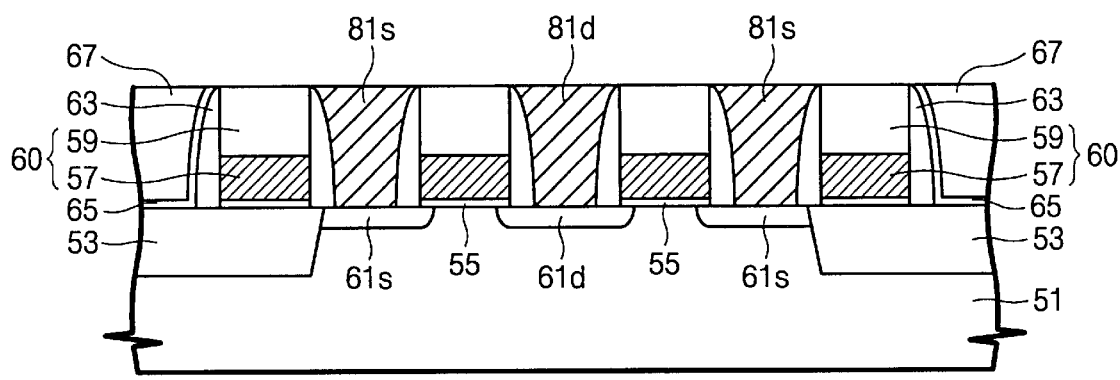

As shown in FIG. 11, the second conductive layer 79, the transformed conductive layer 75a, the hard mask 69 and the lower interlayer insulating layer 67 are continuously etched to form contact pads 81s (source), 81d (drain) in the self-aligned contact holes 71 by using a planarization process until upper surface of the wiring pattern 60 is exposed. The contact pad 81d formed on the common drain region 61d forms bit line contact pad and the contact pads 81s formed on the source regions 61s form storage node contact pads. Moreover, each of the contact pads 81s, 81d has a substantially flat upper surface different from that in the prior art. A planarization process can be carried out by using known chemical-mechanical polishing (CMP), etch back, or combination of these two processes.

Figure 12:
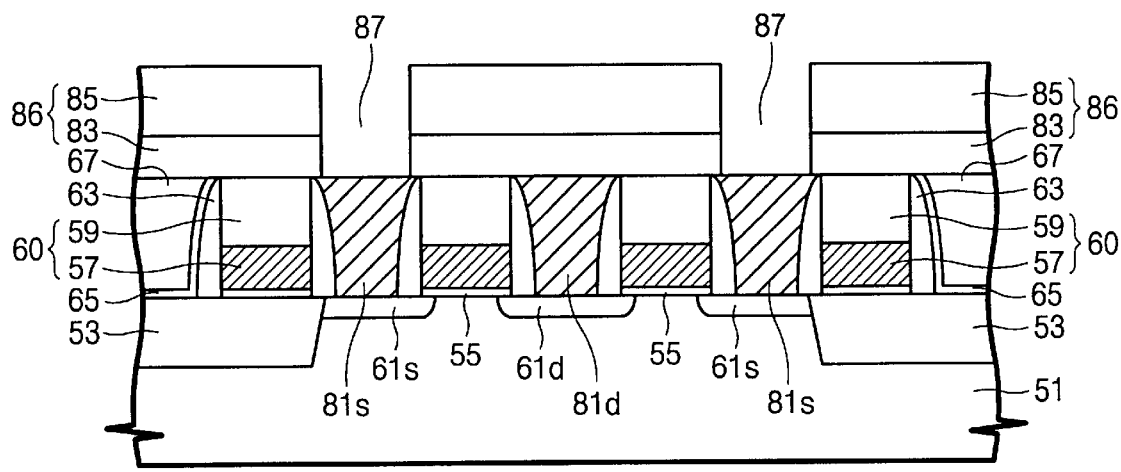

Referring to FIG. 12, a first upper interlayer insulating layer 83 is formed over the substrate as shown. The first upper interlayer insulating layer 83 is then patterned to form bit line contact holes (not shown) which expose the bit line contact pad 81d. On the first upper interlayer insulating layer 83, a bit line (not shown) is formed to substantially cover the bit line contact holes. Thereafter, a second upper interlayer insulating layer 85 is formed over the substrate over which the bit line is formed. The first upper interlayer insulating layer 83 forms an upper interlayer insulating layer 86 along with the second upper interlayer insulating layers 85. Then, the upper interlayer insulating layer 86 is patterned to form storage node contact holes 87 which expose storage node contact pads 81s. After the storage node contact holes 87 are formed, there is no residual material of the upper interlayer insulating layer on upper surfaces of the storage node contact pads 81s, as shown in FIG. 12. Advantageously, each of the contact pads 81d, 81s has a substantially flat upper surface as shown. Thereafter, storage nodes, which fill the storage node contact holes 87, are formed by a general method known in the art.

As apparent from the foregoing description, it can be appreciated that the present invention provides a method of manufacturing a semiconductor device which can prevent voids from being formed in contact pads in self-aligned contact holes, thereby improving contact resistance.

The invention being thus described, it would be obvious that the same may be varied in many ways by one of ordinary skill in the art having had the benefit of the present disclosure. Such variations are not regarded as a departure from the spirit and scope of the invention, and such modifications as would be obvious to one skilled in the art are intended to be included within the scope of the following claims and their legal equivalents.

What is claimed is:

1. A method of manufacturing a semiconductor device, the method comprising:
   forming an insulated wiring pattern on a semiconductor substrate;
   forming a lower interlayer insulating layer on said wiring pattern;
   forming a hard mask on said lower interlayer insulating layer;
   forming self-aligned contact holes to expose said substrate thereunder by partially etching said lower interlayer insulating layer using said hard mask as an etch mask;
   performing a surface treatment which includes isotropically etching sidewalls of said lower interlayer insulating layer exposed through said self-aligned contact holes;
   conformably forming a first conductive layer over said substrate;
   anisotropically etching said first conductive layer which transforms sidewalls of said first conductive layer in said self-aligned contact holes to have a positive slope; and
   forming a second conductive layer over said substrate which fills said self-aligned contact holes.

2. The method of manufacturing a semiconductor device as recited in claim 1, wherein said forming an insulated wiring pattern comprises:
   forming an isolation layer on a given region of said substrate to define an active region;
   forming a gate insulating layer on said active region;
   forming a conductive layer and a capping-insulating layer over substrate;
   forming a plurality of gate electrodes crossing over said active region; and
   forming a capping-insulating layer pattern overlaid on said gate electrodes by pattering continuously said capping-insulating layer and said conductive layer.

3. The method of manufacturing a semiconductor device as recited in claim 2, wherein said capping-insulating layer includes an insulator layer having an etch selectivity with respect to said lower interlayer insulating layer.

4. The method of manufacturing a semiconductor device as recited in claim 2, further comprising forming spacers on sidewalls of said wiring pattern.

5. The method of manufacturing a semiconductor device as recited in claim 4, wherein said spacers are formed of a layer of a same material as said capping-insulating layer.

6. The method of manufacturing a semiconductor device as recited in claim 1, further including forming an etch stop layer over said substrate having said wiring pattern before said forming of said lower interlayer insulating layer.

7. The method of manufacturing a semiconductor device as recited in claim 6, wherein said etch stop layer is formed of a layer of material having an etch selectivity with respect to said lower interlayer insulating layer.

8. The method of manufacturing a semiconductor device as recited in claim 1, wherein said lower interlayer insulating layer is a layer of a silicon oxide.

9. The method of manufacturing a semiconductor device as recited in claim 1, wherein said hard mask is a layer of silicon.

10. The method of manufacturing a semiconductor device as recited in claim 1, wherein said surface treatment process includes:
    removing an etch damage layer formed on a surface of said substrate during said forming of said self-aligned contact holes using a dry cleaning process; and
    removing native oxides and contaminants remaining in the surface of said substrate from which said etch damage layer is removed using a wet cleaning process.

11. The method of manufacturing a semiconductor device as recited in claim 10, wherein said dry cleaning process includes using a fluorine-contained gas, and said wet cleaning process includes using an oxide etchant.

12. The method of manufacturing a semiconductor device as recited in claim 1, wherein said first conductive layer is a layer of doped polysilicon.

13. The method of manufacturing a semiconductor device as recited in claim 1, wherein said second conductive layer is of a same material as said first conductive layer.

14. The method of manufacturing a semiconductor device as recited in claim 1, further comprising forming contact pads having substantially flat surfaces in said self-aligned contact holes by planarization by etching continuously said second conductive layer, said first conductive layer, said hard mask, and said lower interlayer insulating layer until an upper surface of said wiring pattern is exposed, after said forming of said second conductive layer.

15. The method of manufacturing a semiconductor device as recited in claim 14, wherein said planarization is carried out using a process chosen from the group consisting essentially of: chemical-mechanical polishing (CMP), etch back, or a combination of CMP and etch back processes.

16. A method of manufacturing a semiconductor device, the method comprising:

conformably forming a first conductive layer in self-aligned contact holes;

anisotropically etching said first conductive layer which transforms sidewalls of said first conductive layer in said self-aligned contact holes to have a positive slope; and forming a second conductive layer over said substrate which substantially fills said self-aligned contact holes.

* * * * *